(12) United States Patent
Maeshige et al.

(10) Patent No.: US 9,086,629 B2
(45) Date of Patent: Jul. 21, 2015

(54) SUBSTRATE WITH CONDUCTIVE FILM, SUBSTRATE WITH MULTILAYER REFLECTIVE FILM AND REFLECTIVE MASK BLANK FOR EUV LITHOGRAPHY

(71) Applicant: Asahi Glass Company, Limited, Chiyoda-ku (JP)

(72) Inventors: Kazunobu Maeshige, Chiyoda-ku (JP); Kazuyuki Hayashi, Chiyoda-ku (JP); Toshiyuki Uno, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 169 days.

(21) Appl. No.: 13/956,898

(22) Filed: Aug. 1, 2013

(65) Prior Publication Data
US 2013/0323630 A1 Dec. 5, 2013

Related U.S. Application Data

(63) Continuation of application No. PCT/JP2012/052542, filed on Feb. 3, 2012.

(30) Foreign Application Priority Data

Feb. 4, 2011 (JP) .................................. 2011-022769

(51) Int. Cl.
*G03F 1/24* (2012.01)
*G03F 1/22* (2012.01)

(52) U.S. Cl.
CPC ........................ *G03F 1/24* (2013.01)

(58) Field of Classification Search
CPC .................... G03F 1/22; G03F 1/24
USPC ................................. 430/5; 378/35
See application file for complete search history.

(56) References Cited

U.S. PATENT DOCUMENTS 6,352,803 B1  3/2002  Tong et al.
7,736,821 B2  6/2010  Hayashi et al.
(Continued)

FOREIGN PATENT DOCUMENTS

JP  2003-501823  1/2003
JP  2005-210093  8/2005
(Continued)

OTHER PUBLICATIONS

International Search Report issued May 22, 2012 in PCT/JP2012/052542 filed Feb. 3, 2012.
(Continued)

*Primary Examiner* — Stephen Rosasco
(74) *Attorney, Agent, or Firm* — Oblon, McClelland, Maier & Neustadt, L.L.P.

(57) ABSTRACT

To provide a substrate with a conductive film for an EUV mask blank, which has a conductive film having a low sheet resistance, excellent surface smoothness and excellent contact to an electrostatic chuck, and with which deformation of the substrate by the film stress in an EUV mask blank can be suppressed.

A substrate with a conductive film to be used for producing a reflective mask blank for EUV lithography, comprising a conductive film formed on a substrate;
  wherein the conductive film has at least two layers of a layer (lower layer) formed on the substrate side and a layer (upper layer) formed on the lower layer; and
  the lower layer of the conductive film contains chromium (Cr), oxygen (O) and hydrogen (H), and the upper layer of the conductive film contains chromium (Cr), nitrogen (N) and hydrogen (H).

19 Claims, 1 Drawing Sheet

(56) References Cited

U.S. PATENT DOCUMENTS

| | | |
|---|---|---|
| 7,960,077 B2 | 6/2011 | Ikuta et al. |
| 8,003,282 B2 | 8/2011 | Hayashi et al. |
| 2005/0238922 A1 | 10/2005 | Kinoshita et al. |
| 2009/0155698 A1* | 6/2009 | Yamada et al. .................. 430/5 |

FOREIGN PATENT DOCUMENTS

| | | |
|---|---|---|
| JP | 2008/072706 | 6/2008 |
| JP | 2010-45317 | 2/2010 |
| WO | WO 2007/069417 | 6/2007 |
| WO | WO 2008/072706 | 6/2008 |

OTHER PUBLICATIONS

U.S. Appl. No. 13/956,691, filed Aug. 1, 2013, Hayashi, et al.

U.S. Appl. No. 14/288,908, filed May 28, 2014, Hayashi.

U.S. Appl. No. 14/227,523, filed Mar. 27, 2014, Maeshige, et al.

* cited by examiner

SUBSTRATE WITH CONDUCTIVE FILM, SUBSTRATE WITH MULTILAYER REFLECTIVE FILM AND REFLECTIVE MASK BLANK FOR EUV LITHOGRAPHY

TECHNICAL FIELD

The present invention relates to a reflective mask blank for EUV (Extreme Ultra Violet) lithography (in this specification, hereinafter also referred to as "EUV mask blank") to be used for e.g. production of semiconductors, and a substrate with a conductive film and a substrate with a multilayer reflective film to be used for production of the mask blank.

BACKGROUND ART

Heretofore, in the semiconductor industry, a photolithography method employing visible light or ultraviolet light has been used as a technique to transfer a fine pattern required to form an integrated circuit of a fine pattern on e.g. a Si substrate. However, the conventional photolithography method has come close to its limit, while miniaturization of semiconductor devices has been accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF laser (wavelength: 193 nm) is employed, about 45 nm is presumed to be the limit. From this point of view, EUV lithography, which is an exposure technique employing EUV light having a wavelength further shorter than ArF laser, is expected to be prospective as a next generation exposure technique for 45 nm or below. In this specification, EUV light means a light ray having a wavelength within a soft X-ray region or within a vacuum ultraviolet region, specifically a light ray having a wavelength of from about 10 to 20 nm, particularly about 13.5 nm±0.3 nm.

EUV light is likely to be absorbed by all kinds of substances, and the refractive indices of substances at such a wavelength are close to 1, whereby it is not possible to use a conventional dioptric system like photolithography employing visible light or ultraviolet light. For this reason, for EUV lithography, a catoptric system, i.e. a reflective photomask and a mirror, is employed.

A mask blank is a stacked structure for production of a photomask, which has not been patterned yet. In the case of a mask blank for a reflective photomask, it has a structure wherein a reflective layer for reflecting EUV light and an absorber layer for absorbing EUV light, are formed in this order on a substrate made of e.g. glass. As the reflective layer, a multilayer reflective film is usually employed, which has high refractive index layers and low refractive index layers alternately stacked so as to increase the light reflectivity for light applied to a layer surface, more specifically, the light reflectivity for EUV light applied to a layer surface. For the absorber layer, a material having a high extinction coefficient for EUV light, specifically, for example, a material containing Cr or Ta as the main component is employed.

The multilayer reflective film and the absorber layer are formed on an optical surface of a glass substrate by using a sputtering method such as an ion beam sputtering method or a magnetron sputtering method. At times of forming the multilayer reflective film and the absorber layer, the glass substrate is held by a holding means. Examples for the means of holding a glass substrate include a mechanical chuck and an electrostatic chuck. However, from the viewpoint of particle generation, clamping by an electrostatic chuck is preferably employed, as a means of holding the glass substrate when the multilayer reflective film and the absorber layer are formed, particularly as a means of holding the glass substrate when the multilayer reflective film is formed.

Further, in a mask patterning process or mask handling for exposure, clamping by an electrostatic chuck is employed as the means of holding a glass substrate.

The electrostatic chuck is a technique which has been employed for clamping of a silicon wafer in a process for producing semiconductor devices in recent years. Thus, in a case of a substrate such as a glass substrate having a low dielectric constant and a low conductivity, it is necessary to apply a high voltage to obtain a clamping force equivalent to that required for clamping a silicon wafer, and there is a risk of causing a dielectric breakdown.

In order to solve this problem, Patent Document 1 discloses a mask substrate having a back surface coating (conductive film) formed of a material, such as Si, Mo, chromium oxynitride (CrON) or TaSi other than commonly used Cr, which has a higher dielectric constant and a higher conductivity than those of glass substrate, as a layer for promoting the electrostatic chucking of the substrate.

However, in the mask substrate disclosed in Patent Document 1, since the CrON film has a low adhesion to the glass substrate, there is a problem that peeling occurs between the glass substrate and the CrON film at the time of forming a multilayer reflective film or an absorber layer with the result that particles are formed. Particularly, in the vicinity of the interface between the electrostatic chuck and the CrON film, peeling of the film tends to be caused by a force applied to the vicinity of the interface between the substrate and the electrostatic chuck, which is produced by rotation of the substrate.

Further, since in the mask substrate disclosed in Patent Document 1, a conductive film is formed on the entire region of one surface including chamfers and side faces of the substrate, the adhesive forces of the film to the chamfers and side faces of the substrate are particularly weak since the conductive film is obliquely formed on the chamfers and side faces, and the peeling of the film tends to be caused by warpage of the substrate at a time of clamping by an electrostatic chuck or by contact with an end effecter of a robot arm.

Further, in the mask substrate disclosed in Patent Document 1, since oxygen (O) and carbon (C) are contained in large amounts in a surface of the CrON conductive film, abnormal discharge may occur in the process of forming a multilayer reflective film or an absorber film in some deposition conditions.

Such peeling of a conductive film at a time of e.g. clamping by an electrostatic chuck (or at a time of forming a multilayer reflective film or the like) or particle generation due to abnormal discharge at a time of film-forming, increases defects in a product (a substrate with a multilayer reflective film, a reflective mask blank for exposure or a reflective mask for exposure), and prevents production of high quality product. In a case of pattern transfer by using a conventional transmission mask for exposure, since the wavelength of exposure light is relatively long in a UV region (about 157 to 248 nm), even if concave or convex defects are formed on a mask surface, a critical problem is unlikely caused, and accordingly, the generation of particles at a time of film-forming has not been recognized as a major problem. However, in a case of using light having a short wavelength such as EUV light as exposure light, even fine concave or convex defects on a mask surface have a major influence on pattern transfer, and accordingly, generation of particles cannot be ignored.

In order to solve the above problems, Patent Document 2 discloses a substrate with a multilayer reflective film in which particle generation due to peeling of a conductive film at a time of clamping the substrate with a conductive film by an electrostatic chuck or generation of particles due to abnormal discharge are prevented; a high quality reflective mask blank for exposure having few surface defects due to particles; and a high quality reflective mask for exposure having no pattern defect due to particles.

In order to solve the above problems, the substrate with a multilayer reflective film disclosed in Patent Document 2 comprises a conductive film having a composition varying in the thickness direction of the conductive film so that a substrate side of the conductive film contains nitrogen (N) and a surface side of the film contains at least one of oxygen (O) and carbon (C). With respect to the reason why the conductive film has such a structure, Patent Document 2 discloses that nitrogen (N) contained in the substrate side of the conductive film improves the adhesion of the conductive film to the substrate to prevent the conductive film from peeling, and that nitrogen reduces the film stress of the conductive film to allow increase of the attractive force between an electrostatic chuck and the substrate. Further, at least one of oxygen (O) and carbon (C) contained in the surface side of the conductive film increases the surface roughness of the conductive film to an appropriate level, to increase the attractive force between an electrostatic chuck and the substrate at a time of clamping by the electrostatic chuck, to thereby prevent abrasion between the electrostatic chuck and the substrate. Here, oxygen (O) contained in the conductive film roughens the surface roughness (increases the surface roughness) to an appropriate level, and increases the attractive force between the electrostatic chuck and the substrate, and carbon (C) contained in the conductive film decreases the specific resistance of the conductive film to thereby improve the attractive force between the electrostatic chuck and the substrate, according to this document.

In the substrate with a multilayer reflective film disclosed in Patent Document 2, at least one of oxygen (O) and carbon (C) contained in a surface side of the conductive film produces an appropriately roughened state in the surface of the conductive film, to thereby increase the attractive force between an electrostatic chuck and the substrate at a time of clamping by an electrostatic chuck, and to prevent abrasion between the electrostatic chuck and the substrate. However, there is a problem that if abrasion has already occurred, the presence of large surface roughness tends to cause peeling or chipping off of the film to generate particles. Further, when the surface roughness is large, particles (for example, particles from the material of electrostatic chuck or particles of e.g. Mo or Si which is the film material of the film to be formed) on the electrostatic chuck tend to adhere to the conductive film at a time of electrostatic chucking, and since such particles are hard to be cleaned off, there occurs a problem that these particles drop in subsequent steps (e.g. transfer, cleaning or inspection) to cause new defects.

Further, if the substrate side of the conductive film is CrN, since the content of nitrogen (N) is from 40 to 60 at %, the sheet resistance of the conductive film does not becomes sufficiently low, and it is not possible to sufficiently increase the clamping force by the electrostatic chuck. As a result, it is not possible to sufficiently increase the contact between the electrostatic chuck and the substrate with a conductive film.

In order to solve the above problems of the substrate with a multilayer reflective film disclosed in Patent Document 2, the present applicant has proposed in Patent Document 3 a substrate with a conductive film for an EUV mask blank, the conductive film containing chromium (Cr) and nitrogen (N), the average concentration of N in the conductive film being at least 0.1 at % and less than 40 at %, the crystal state of at least a surface of the conductive film being amorphous, the sheet resistance of the conductive film being at most 27 $\Omega/\square$, and the surface roughness (rms) of the conductive film being at most 0.5 nm. Further, the present applicant proposes an EUV mask blank to be prepared by using the substrate with a conductive film, a substrate with a multilayer reflective film for the mask blank, and a reflective mask prepared by using the mask blank.

In the substrate with a conductive film disclosed in Patent Document 3, the surface roughness of a surface of the conductive film is small, which improves the contact with an electrostatic chuck. Further, the sheet resistance of the conductive film is low, which improves the clamping force by the electrostatic chuck. As a result, when the substrate with a conductive film is fixed to an electrostatic chuck and used for producing an EUV mask blank, its contact with the electrostatic chuck is improved. When the contact with the electrostatic chuck is improved, the generation of particles by abrasion with the electrostatic chuck is prevented.

As disclosed above, an EUV mask bland is produced by forming thin films such as a reflective layer (multilayer reflective film) and an absorber layer on a substrate. When the thin films are formed on the substrate, on the film after formation, a film stress (i.e. a compressive stress or a tensile stress) may be generated in some cases. Application of such a film stress may cause deformation of the substrate. Since a substrate made of low expansion glass is usually used as a substrate for EUV mask blank, deformation of the substrate caused by application of a film stress is slight and has not been recognized as a problem.

However, due to demands for miniaturization of the pattern, slight deformation of the substrate (i.e. deformation of the substrate caused by application of a film stress) which has not been recognized as a problem, becomes problematic. For example, in a case where deformation with a certain size or larger is present on a substrate for an EUV mask blank, specifically, in a case of a 152 mm square substrate commonly used for producing an EUV mask blank, if the warpage of the substrate exceeds 0.8 µm, the accuracy of position of the pattern may be reduced at the time of patterning the EUV mask blank. Further, if warpage of such a size occurs, pattern position gap or pattern defects may occur at the time of pattern transferring using a reflective mask prepared from such an EUV mask blank.

PRIOR ART DOCUMENTS

Patent Documents

Patent Document 1: JP-A-2003-501823
Patent Document 2: JP-A-2005-210093
Patent Document 3: JP-A1-2008-072706

DISCLOSURE OF INVENTION

Technical Problem

To overcome the above problems of prior art, the object of the present invention is to provide a substrate with a conductive film for an EUV mask blank, which has a conductive film having a low sheet resistance, excellent surface smoothness and excellent contact with an electrostatic chuck, and with which deformation of the substrate by a film stress in an EUV mask blank can be suppressed.

Another object of the present invention is to provide a substrate with a multilayer reflective film for an EUV mask blank using the substrate with a conductive film, and an EUV mask blank.

Solution to Problem

To achieve the above objects, the present invention provides a substrate with a conductive film to be used for producing a reflective mask blank for EUV lithography, comprising a conductive film formed on a substrate;

wherein the conductive film has at least two layers of a layer (lower layer) formed on the substrate side and a layer (upper layer) formed on the lower layer; and the lower layer of the conductive film contains chromium (Cr), oxygen (O) and hydrogen (H), and the upper layer of the conductive film contains chromium (Cr), nitrogen (N) and hydrogen (H).

In the substrate with a conductive film of the present invention, it is preferred that in the lower layer of the conductive film, the total content of Cr and O is from 85 to 99.9 atomic % (hereinafter atomic % will be referred to as at %), and the content of H is from 0.1 to 15 at %.

Further, it is preferred that the compositional ratio (atomic ratio) of Cr to O in the lower layer of the conductive film is Cr:O=9:1 to 3:7.

In the substrate with a conductive film of the present invention, it is preferred that in the upper layer of the conductive film, the total content of Cr and N is from 85 to 99.9 at %, and the content of H is from 0.1 to 15 at %.

Further, it is preferred that the compositional ratio (atomic ratio) of Cr to N in the upper layer of the conductive film is Cr:N=9.5:0.5 to 3:7.

In the substrate with a conductive film of the present invention, it is preferred that the film thickness of the lower layer of the conductive film is from 1 to 30 nm.

In the substrate with a conductive film of the present invention, it is preferred that the film thickness of the upper layer of the conductive film is from 50 to 300 nm.

In the substrate with a conductive film of the present invention, it is preferred that the sheet resistance of the conductive film is at most 20Ω/□.

In the substrate with a conductive film of the present invention, it is preferred that the conductive film has a compressive stress of from 300 MPa to 900 MPa.

In the substrate with a conductive film of the present invention, it is preferred that the lower layer of the conductive film is in an amorphous state.

In the substrate with a conductive film of the present invention, it is preferred that the upper layer of the conductive film is in an amorphous state.

In the substrate with a conductive film of the present invention, it is preferred that the surface roughness (rms) of the conductive film is at most 0.5 nm.

In the substrate with a conductive film of the present invention, it is preferred that the lower layer of the conductive film is formed by a sputtering method using a Cr target in an atmosphere containing an inert gas including at least one member selected from the group consisting of helium (He), argon (Ar), neon (Ne), krypton (Kr) and xenon (Xe), and oxygen ($O_2$) and hydrogen ($H_2$), at an atmospheric temperature during sputtering of from 60 to 120° C.

In the substrate with a conductive film of the present invention, it is preferred that the upper layer of the conductive film is formed by a sputtering method using a Cr target in an atmosphere containing an inert gas including at least one member selected from the group consisting of helium (He), argon (Ar), neon (Ne), krypton (Kr) and xenon (Xe), and nitrogen ($N_2$) and hydrogen ($H_2$), at an atmospheric temperature during sputtering of from 60 to 120° C.

The present invention further provides a substrate with a multilayer reflective film for a reflective mask blank for EUV lithography, which is the substrate with a conductive film of the present invention, further comprising a multilayer reflective film formed on a surface of the substrate opposite from a surface on which the conductive film is formed (hereinafter in this specification referred to as "the substrate with a multilayer reflective film of the present invention").

The substrate with a multilayer reflective of the present invention is preferably such that the warpage of the substrate is at most 0.8 μm.

The present invention further provides a reflective mask blank for EUV lithography, which is the substrate with a multilayer reflective film of the present invention, further comprising an absorber layer formed on the multilayer reflective film (hereinafter in this specification referred to as "the EUV mask blank of the present invention").

The reflective mask blank for EUV lithography of the present invention is preferably such that the warpage of the substrate is at most 0.8 μm.

The present invention further provides a reflective mask for EUV lithography produced by patterning the EUV mask blank of the present invention (hereinafter in this specification referred to as "the EUV mask of the present invention").

In this specification, "to" used to show the range of the numerical values is used to include the numerical values before and after it as the lower limit value and the upper limit value, and unless otherwise specified, the same applies hereinafter.

Advantageous Effects of Invention

By using the substrate with a conductive film of the present invention, deformation of the substrate by a film stress in an EUV mask blank can be suppressed.

Further, with the substrate with a conductive film of the present invention, which has a conductive film of a two-layer structure having an upper layer which mainly contributes to reduction of the resistance of the conductive film and a lower layer which mainly contributes to an improvement in the adhesion to the substrate, while the sheet resistance of the conductive film is made low, peeling of the conductive film from the substrate is less likely to occur, whereby occurrence of defects can be suppressed.

Further, in the substrate with a conductive film of the present invention, the surface roughness of a surface of the conductive film is small, which improves the contact with an electrostatic chuck. Further, the sheet resistance of the conductive film is low, which improves the clamping force by an electrostatic chuck. As a result, when the substrate with a conductive film is fixed to an electrostatic chuck and used for producing an EUV mask blank, its contact with the electrostatic chuck is improved. When the contact with the electrostatic chuck is improved, the generation of particles due to abrasion between the electrostatic chuck and the substrate is prevented.

Further, when each layer (particularly the upper layer) constituting the conductive film is in an amorphous state, the conductive film is hardly oxidized and the change in stress in the conductive film over time is small. As a result, it is expected that the deterioration of pattern accuracy be suppressed and the lifetime of the produced mask increase.

DESCRIPTION OF EMBODIMENTS

Figure 1:
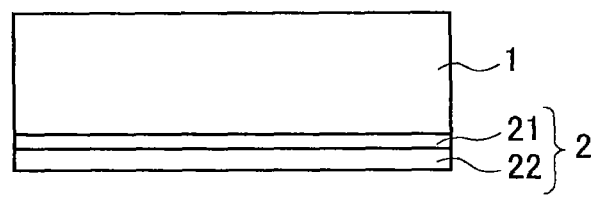
FIG. 1 is a schematic view illustrating a substrate with a conductive film of the present invention.

Now, the present invention will be disclosed with reference to the drawings. FIG. 1 is a schematic view illustrating a substrate with a conductive film of the present invention. In FIG. 1, the substrate 1 for film-forming has a surface on which a conductive film 2 is formed. At a time of forming a multilayer reflective film and an absorber layer on the substrate 1, the substrate 1 is fixed to an electrostatic chuck via the conductive film 2. As disclosed later, the multilayer reflective film and the absorber layer are formed on an opposite side (film-forming surface) of the substrate 1 from a surface on which the conductive film 2 is formed. In short, the conductive film 2 is a back side conductive film formed on a back side of the substrate 1 from the film-forming surface.

As shown in FIG. 1, the conductive film 2 has a two-layer structure of a lower layer 21 formed on the substrate 1 side and an upper layer 22 formed on the lower layer 21.

In the conductive film 2 having a two-layer structure, the upper layer 22 has a function to lower the resistance of the entire conductive film 2. On the other hand, the lower layer 21 has a function as an adhesion-improving layer to improve the adhesion between the substrate 1 and the conductive film 2. By such a structure, while the sheet resistance of the conductive film 2 is made low, peeling of the conductive film from the substrate is less likely to occur, whereby occurrence of defects can be suppressed.

To achieve the above function, the lower layer 21 of the conductive film 2 is required to be excellent in the adhesion to the substrate 1.

Further, the lower layer 21 constituting a part of the conductive film 2 is required to have a dielectric constant and a conductivity higher than those of the material of the substrate 1.

Still further, in order to improve smoothness on the surface of the lower layer 21, the lower layer is preferably in an amorphous state. When the smoothness of the surface of the lower layer 21 is improved, the smoothness of the surface of the upper layer 22 formed on the lower layer 21 will also be improved, whereby improvement in the smoothness of the surface of the conductive film 2 is expected.

In this specification, "in an amorphous state" means not only a state of amorphous structure having no crystal structure at all but also a state of a microcrystal structure.

Whether the lower layer 21 is in an amorphous state, i.e. in a state of amorphous structure or microcrystal structure, may be confirmed by an X-ray diffraction (XRD) method. When the lower layer 21 has an amorphous structure or a microcrystal structure, no sharp peak will be observed among the diffraction peaks obtained by the XRD measurement.

To satisfy the above, the lower layer 21 contains chromium (Cr), oxygen (O) and hydrogen (H).

It is preferred that in the lower layer 21, the total content of Cr and O is from 85 to 99.9 at %, and the content of H is from 0.1 to 15 at %.

If the content of H in the lower layer 21 is less than 0.1 at %, the lower layer 21 will not be in an amorphous state, whereby the smoothness of the surface of the lower layer 21 will be lowered, whereby the surface roughness may be large. On the other hand, also in a case where the H content is higher than 15 at %, the lower layer 21 will not be in an amorphous state, and the smoothness of the surface of the lower layer 21 will be lowered, whereby the surface roughness may be large. Further, if the total content of Cr and O in the lower layer 21 is less than 85 at %, the surface roughness may be large.

In the lower layer 21, the compositional ratio of Cr and O is preferably Cr:O=9:1 to 3:7.

If the amount of Cr is larger than the above compositional ratio, the stress will not be a compressive stress, and no appropriate warpage will be realized, and on the other hand, if O is larger than the above compositional ratio, defects may increase.

In the lower layer 21, the content of H is more preferably from 0.1 to 13 at %, further preferably from 0.1 to 10 at %, particularly preferably from 0.1 to 8 at %. Further, the total content of Cr and O is more preferably from 87 to 99.9 at %, further preferably from 90 to 99.9 at %, particularly preferably from 92 to 99.9 at %. Further, the compositional ratio of Cr to O is preferably from 9:1 to 2.5:7.5, more preferably from 8.5:1.5 to 2.5:7.5, particularly preferably from 8:2 to 2.5:7.5.

By the lower layer 21 having the above constitution, the lower layer 21 is in an amorphous state, and its surface is excellent in the smoothness.

Regarding the smoothness, the surface roughness (rms) of the lower layer 21 is preferably at most 0.5 nm. When the surface roughness (rms) of the lower layer 21 is at most 0.5 nm, the surface of the lower layer 21 is sufficiently smooth, and accordingly it is expected that the surface roughness (rms) of the upper layer 22 formed on the lower layer 21 is also at most 0.5 nm. The surface roughness of the lower layer 21 can be measured by using an atomic force microscope.

The surface roughness (rms) of the lower layer 21 is more preferably at most 0.4 nm, further preferably at most 0.3 nm.

The film thickness of the lower layer 21 is preferably from 1 to 30 nm. If the film thickness of the lower layer 21 is less than 1 nm, the adhesive force of the lower layer 21 to the substrate 1 will be lowered, whereby the conductive film 2 may be peeled. On the other hand, if the film thickness of the lower layer 21 is thicker than 30 nm, the sheet resistance of the conductive film 2 may be high. Further, the upper layer 22 to be formed on the lower layer 21 may not be in an amorphous state.

The film thickness of the lower layer 21 is more preferably from 2 to 28 nm, further preferably from 2 to 20 nm.

To achieve the above function, the upper layer 22 of the conductive film 2 is required to have a dielectric constant and a conductivity higher than those of the material of the substrate 1.

Further, in order to improve the smoothness of the surface of the upper layer 22 constituting the surface of the conductive film 2, the upper layer 22 is preferably in an amorphous state.

Here, the surface of the conductive film 2 is required to have excellent smoothness because such is favorable to prevent the generation of particles due to abrasion between the electrostatic chuck and the conductive film 2 when the substrate with a conductive film is clamped by the electrostatic chuck.

Still further, the surface of the upper layer 22 constituting the surface of the conductive film 2 preferably has a high surface hardness from the following reason.

Here, the surface of the conductive film 2 is required to have a high surface hardness because such is preferred, when the substrate with a conductive film is fixed to an electrostatic chuck and used for producing an EUV mask blank, to prevent the generation of particles due to abrasion between the electrostatic chuck and the conductive film.

Further, as disclosed below, in order to obtain a conductive film 2 having a compressive stress of from 300 to 900 MPa, it is preferred that the upper layer 22 has a compressive stress. Here, in order to make the resistance of the entire conductive film 2 low, in the conductive film 2 having a two-layer structure, the upper layer 22 is thicker than the lower layer 21. Accordingly, the upper layer 22 preferably has a compressive stress because since it is thicker than the lower layer 21, it is easy to adjust the film stress of the (entire) conductive film 2 to be a compressive stress.

In order to satisfy the above, the upper layer 22 contains chromium (Cr), nitrogen (N) and hydrogen (H).

It is preferred that in the upper layer 22, the total content of Cr and N is from 85 to 99.9 at %, and the content of H is from 0.1 to 15 at %.

If the content of H is less than 0.1 at %, the upper layer 22 will not be in an amorphous state, and the smoothness of the surface of the upper layer 22 constituting the surface of the conductive film 2 will be lowered, whereby the surface roughness may be large. Further, if the total content of Cr and N in the upper layer 22 is less than 85 at %, the surface roughness may be large.

On the other hand, also in a case where the content of H is higher than 15 at %, the upper layer 22 will not be in an amorphous state, and the smoothness of the surface of the upper layer 22 constituting the surface of the conductive film 2 will be lowered, whereby the surface roughness may be large.

Further, it is preferred that in the upper layer 22, the compositional ratio of Cr to N is preferably Cr:N=9.5:0.5 to 3:7. If the amount of Cr is larger than the above compositional ratio, the stress will not be a compressive stress, and no appropriate warpage will be realized, and on the other hand, if the amount of N is larger than the above compositional ratio, defects may increase.

The content of H in the upper layer 22 is more preferably from 0.1 to 13 at %, more preferably from 0.1 to 10 at %, particularly preferably from 0.1 to 8 at %. Further, the total content of Cr and N is more preferably from 87 to 99.9 at %, further preferably from 90 to 99.9 at %, particularly preferably from 92 to 99.9 at %. Further, the compositional ratio of Cr to N is, with a view to suppressing defects at a time of film-forming, preferably from 9.5:0.5 to 6:4, more preferably from 9.5:0.5 to 6.5:3.5, particularly preferably from 9.5:0.5 to 7:3.

By the upper layer 22 having the above constitution, the upper layer 22 is in an amorphous state, and its surface is excellent in the smoothness. The amorphous state of the upper layer 22 can be confirmed by an XRD method. When the upper layer 22 is in an amorphous state, no sharp peak will be observed among the diffraction peaks obtained by the XRD measurement.

Regarding the smoothness, the surface roughness (rms) of the upper layer 22 is preferably at most 0.5 nm. When the surface roughness (rms) of the upper layer 22 constituting the surface of the conductive film 2 is at most 0.5 nm, the contact with the electrostatic chuck will be improved, whereby generation of particles due to abrasion between the electrostatic chuck and the conductive film 2 will be prevented. The surface roughness of the upper layer 22 can be measured by an atomic force microscope.

The surface roughness (rms) of the upper layer 22 is more preferably at most 0.4 nm, further preferably at most 0.3 nm.

The film thickness of the upper layer 22 is preferably from 50 to 300 nm. If the film thickness of the upper layer 22 which has a function to lower the resistance of the entire conductive film 2 is less than 50 nm, the sheet resistance of the conductive film 2 may not be made low. On the other hand, if the film thickness of the upper layer 22 is thicker than 300 nm, the increase in the film thickness will no longer contribute to the improvement in the function of the upper layer 22, and the time required for formation of the upper layer 22 will increase, thus leading to an increase in the cost required for formation of the upper layer 22 and thus the conductive film 2. Further, since the film thickness of the upper layer 22 and thus the conductive film 2 is thicker than necessary, film peeling is likely to occur.

The film thickness of the upper layer 22 is more preferably from 100 to 250 nm, further preferably from 150 to 220 nm.

In the lower layer 21 and the upper layer 22 constituting the conductive film 2, the content of components to be impurities (in the case of the lower layer 21, components other than Cr, O and H, and in the case of the upper layer 22, components other than Cr, N and H) is preferably low, and it is more preferred that substantially no such components are contained, since such components may impair the after-mentioned properties required for the conductive film 2, particularly the film stress property of the conductive film 2. If the components to be impurities are contained, their content is preferably at most 3% with a view to controlling the compressive stress.

The lower layer 21 and the upper layer 22 of the conductive film 2 may be formed by a known film deposition method, e.g. a sputtering method such as a magnetron sputtering method or an ion beam sputtering method. In a case where the lower layer 21 and the upper layer 22 are formed by a sputtering method, a sputtering method is carried out using a Cr target in an atmosphere containing an inert gas including at least one member selected from the group consisting of helium (He), argon (Ar), neon (Ne), krypton (Kr) and xenon (Xe), either one of oxygen ($O_2$) and nitrogen ($N_2$), and hydrogen ($H_2$). In a case where a magnetron sputtering method is employed, specifically, it is carried out under the following deposition conditions.

[Deposition Conditions for Lower Layer 21]

Sputtering gas: a mixed gas of Ar, $O_2$ and $H_2$ ($H_2$ gas concentration: 1 to 50 vol %, preferably 1 to 30 vol %, $O_2$ gas concentration: 1 to 80 vol %, preferably 5 to 75 vol %, Ar gas concentration: 5 to 95 vol %, preferably 10 to 94 vol %, gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa).

Input power: 30 to 3,000 W, preferably 100 to 3,000 W, more preferably 500 to 3,000 W Deposition rate: 0.5 to 60 nm/min, preferably 1.0 to 45 nm/min, more preferably 1.5 to 30 nm/min

[Deposition Conditions for Upper Layer 22]

Sputtering gas: a mixed gas of Ar, $N_2$ and $H_2$ ($H_2$ gas concentration: 1 to 50 vol %, preferably 1 to 30 vol %, $N_2$ gas concentration: 1 to 80 vol %, preferably 5 to 75 vol %, Ar gas concentration: 5 to 95 vol %, preferably 10 to 94 vol %, gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa).

Input power: 30 to 3,000 W, preferably 100 to 3,000 W, more preferably 500 to 3,000 W Deposition rate: 0.5 to 60 nm/min, preferably 1.0 to 45 nm/min, more preferably 1.5 to 30 nm/min In a case where an inert gas other than Ar is used, the concentration of the inert gas is preferably within the same concentration range as the above Ar gas concentration. Further, in a case where a plurality of inert gases are used, the total concentration of the inert gases is preferably within the same concentration range as the above Ar gas concentration.

Here, in either case of the lower layer 21 and the upper layer 22, the atmospheric temperature during sputtering is preferably from 60 to 120° C., whereby peeling of deposits of the film deposition material formed on the inner wall of the deposition apparatus will be suppressed, whereby defects of the conductive film 2 to be formed can be reduced.

In a case where the lower layer 21 and the upper layer 22 are formed by the sputtering method, a diffusion layer may be formed between them in some cases. Even the film having such a diffusion layer formed is also the conductive film 2 having a two-layer structure in the present invention (i.e. the conductive film 2 having the lower layer 21 and the upper layer 22).

Further, the conductive film 2 in the present invention may have a layer other than the lower layer 21 and the upper layer 22.

Of the conductive film 2, the sheet resistance is preferably at most 20Ω/□. When the sheet resistance of the conductive film 2 is at most 20Ω/□, the clamping force by the electrostatic chuck will be increased, whereby the contact with the electrostatic chuck will be improved. As a result, generation of particles due to abrasion between the electrostatic chuck and the conductive film 2 will be prevented.

The sheet resistance of the conductive film 2 is more preferably at most 15Ω/□, further preferably at most 10Ω/□.

The conductive film 2 preferably has a compressive stress of from 300 MPa to 900 MPa.

As disclosed above, with respect to the EUV mask blank, deformation of the substrate by the film stress generated in thin films (i.e. the reflective layer and the absorber layer) formed on the substrate becomes problematic. The film stress generated on the film-forming surface side of the substrate varies depending upon the composition and the film thickness for each film and the deposition conditions for the film, and in the case of the conductive film 2, when it has a compressive stress of from 300 MPa to 900 MPa, the stress generated on the film-forming surface side of the substrate and the stress generated on the back side of the substrate cancel out each other and as a result, deformation of the substrate caused by application of a stress can be suppressed. Specifically, in the case of a substrate with a multilayer reflective film using a rectangular substrate within a range of from 150 mm to 154 mm, including a 152 mm square substrate commonly used for producing an EUV mask blank, and a reflective mask blank for EUV lithography which is the substrate with a multilayer reflective film further comprising an absorber layer formed on the multilayer reflective film, the warpage of the substrate formed by application of a stress can be suppressed to be at most 0.8 μm, more preferably at most 0.7 μm, further preferably at most 0.6 μm.

Therefore, the possibility of a decrease in the accuracy of position of the pattern at the time of patterning the EUV mask blank is reduced. Further, the pattern position gap or pattern defects will not occur at the time of pattern transferring using a reflective mask prepared from the EUV mask blank. Here, the warpage of the substrate is obtained by measuring the shape by a laser interferometer, and based on an assumed plane calculated by the least-squares method of all data on the substrate surface in a measured region as the standard surface, calculating the difference between the positive maximum value and the negative minimum value in the measured region.

In the step of producing an EUV mask blank, a film stress is generated only on the back side of the substrate, however, at this stage, since the substrate is clamped by an electrostatic chuck, the substrate will not be deformed by application of the film stress.

As disclosed for the upper layer 22, the surface roughness (rms) of the conductive film 2 is preferably at most 0.5 nm. When the surface roughness (rms) of the conductive film 2 is at most 0.5 nm, the contact with the electrostatic chuck will be improved, whereby generation of particles due to abrasion between the electrostatic chuck and the conductive film 2 will be prevented.

The surface roughness (rms) of the conductive film 2 is more preferably at most 0.4 nm, further preferably at most 0.3 nm.

The conductive film 2 preferably has a surface hardness of at least 12 GPa. When the surface hardness of the conductive film 2 is at least 12 GPa, the conductive film 2 will be excellent in the surface hardness, and has an excellent effect to prevent, when the substrate with a conducive film is fixed to an electrostatic chuck and used for producing an EUV mask, generation of particles due to abrasion between the electrostatic chuck and the conductive film. Here, the method of measuring the surface hardness of the conductive film 2 is not particularly limited, and a known method, specifically for example, a Vickers hardness test, a Rockwell hardness test, a Brinell hardness test or a nanoindentation test may be employed. Among them, the nanoindentation test is widely used to measure the surface hardness of a thin film.

In the substrate with a conductive film of the present invention, the substrate 1 for film-forming is required to satisfy the characteristics that a substrate of an EUV mask blank should possess. Accordingly, the substrate 1 is required to have a low thermal expansion coefficient, and specifically, it is required to have a thermal expansion coefficient of $0\pm0.05\times10^{-7}/°$ C., particularly preferably $0\pm0.03\times10^{-7}/°$ C., at 20° C. Further, the substrate is preferably excellent in smoothness, flatness and resistance to a cleaning liquid used for cleaning the mask blank or the photomask after patterning.

As the substrate 1, specifically, glass having a low thermal expansion coefficient such as $SiO_2$—$TiO_2$ glass may be used. However, it is not limited to such glass, and a substrate of crystallized glass having a β quartz solid solution precipitated, quartz glass, silicon, a metal or the like may be employed.

The substrate 1 preferably has a smooth surface having a surface roughness (rms) of at most 0.15 nm and a flatness of at most 100 nm, for the purpose of obtaining a high reflectivity and a high transfer accuracy in a photomask after patterning.

The size, the thickness, etc. of the substrate 11 is appropriately determined depending on the design values of the mask. In Examples described later, $SiO_2$—$TiO_2$ glass having external dimensions of about 6 inches (152 mm) square and a thickness of about 0.25 inch (6.3 mm) was used.

Figure 2:
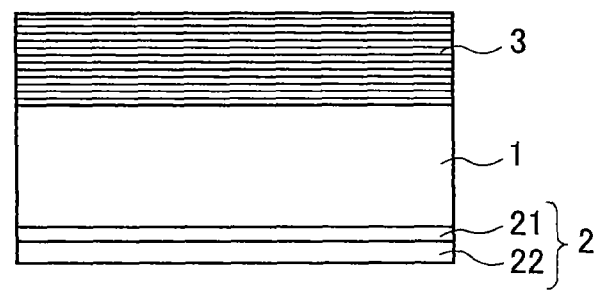
FIG. 2 is a schematic view illustrating a substrate with a multilayer reflective film of the present invention.

Now, the substrate with a multilayer reflective film of the present invention will be disclosed. FIG. 2 is a schematic view illustrating a substrate with a multilayer reflective film of the present invention. As shown in FIG. 2, a multilayer reflective film 3 is formed on a surface of a substrate 1 opposite from a surface on which a conductive film 2 is formed. Here, the substrate 1 and the conductive film 2 are as shown in FIG. 1 (the substrate with a conductive film of the present invention). The substrate with a multilayer reflective film of the present invention can be obtained by fixing the substrate with a conductive film of the present invention onto an electrostatic chuck, and forming the multilayer reflective film 3 on a film-forming surface of the substrate 1 by using a sputtering method such as a magnetron sputtering method or an ion beam sputtering method.

The multilayer reflective film 3 to be formed on the substrate 1 is not particularly limited so long as it has desired characteristics as a reflective layer of an EUV mask blank. Here, the characteristic particularly required for the multilayer reflective film 3 is having a high EUV light reflectivity. Specifically, when the surface of the multilayer reflective film 3 is irradiated with light at a wavelength region of EUV light at an incident angle of 6 degrees, the maximum value of the light reflectivity at a wavelength in the vicinity of 13.5 nm is preferably at least 60%, more preferably at least 65%.

The multilayer reflective film 3 satisfying the above characteristics may, for example, be a Mo/Si multilayer reflective film comprising a plurality of Si films and Mo films alternately stacked, a Be/Mo multilayer reflective film comprising Be films and Mo films alternately stacked, a Si compound/Mo compound multilayer reflective film comprising Si compound films and Mo compound films alternately stacked, a Si/Mo/Ru multilayer reflective film comprising Si films, Mo films and Ru films repeatedly stacked in this order, or a Si/Ru/Mo/Ru multilayer reflective film comprising Si films, Ru films, Mo films and Ru films repeatedly stacked in this order.

The procedure for forming the multilayer reflective film 3 on the film-forming surface of the substrate 1 may be a commonly used procedure for forming a multilayer reflective film using a sputtering method. For example, in a case of forming a Mo/Si multilayer reflective film by using an ion beam sputtering method, it is preferred that a Si film is deposited by using a Si target as a target and Ar gas (gas pressure: $1.3\times10^{-2}$ Pa to $2.7\times10^{-2}$ Pa) as a sputtering gas under an ion acceleration voltage of from 300 to 1,500 V at a film-deposition rate of from 0.03 to 0.30 nm/sec so as to have a thickness of 4.5 nm, and subsequently a Mo film is deposited by using a Mo target as a target and Ar gas (gas pressure: $1.3\times10^{-2}$ Pa to $2.7\times10^{-2}$ Pa) as a sputtering gas under an ion acceleration voltage of from 300 to 1,500 V at a film-deposition rate of from 0.03 to 0.30 nm/sec so as to have a thickness of 2.3 nm. Taking the above process as one cycle, from 40 to 50 cycles of deposition of a Si film and a Mo film are carried out to form a Mo/Si multilayer reflective film. When the multilayer reflective film 3 is to be formed, in order to achieve a uniform film thickness, film deposition is carried out preferably while the substrate is rotated by a rotator.

In order to prevent oxidization of a surface of the multilayer reflective film 3, in the substrate with a multilayer reflective film of the present invention, the uppermost layer of the multilayer reflective film 3 is preferably a layer made of a material hard to be oxidized. The layer made of a material hard to be oxidized functions as a cap layer of the multilayer reflective film 3. As a specific example of the layer made of a material hard to be oxidized functioning as a cap layer, a Si layer may be mentioned. When the multilayer reflective film is a Mo/Si multilayer reflective film, by providing a Si layer as the uppermost layer, it is possible to allow the uppermost layer to function as a cap layer. In this case, the film thickness of the cap layer is preferably 11±2 nm.

Since the substrate with a multilayer reflective film of the present invention employs the substrate with a conductive film of the present invention, at a time of forming the multilayer reflective film while the substrate with a conductive film is fixed to an electrostatic chuck, it is possible to prevent generation of particles due to abrasion between the electrostatic chuck and the conductive film 2. Accordingly, the substrate with a multilayer reflective film is excellent in that it has extremely low surface defects due to particles.

Further, in the substrate with a multilayer reflective film of the present invention, the stress generated on the film-forming surface side of the substrate and the stress generated on the back side of the substrate cancel out each other and as a result, deformation of the substrate formed by application of a stress can be suppressed. Specifically, in the case of a 152 mm square substrate commonly used for producing an EUV mask blank, the warpage of the substrate formed by application of a stress can be suppressed to be at most 0.8 μm, more preferably at most 0.7 μm, further preferably at most 0.6 μm.

Since the warpage of the substrate formed by application of a stress is suppressed as above, at a time of producing an EUV mask blank using the substrate with a multilayer reflective film of the present invention, an effect to improve the film formation accuracy of the absorber layer to be formed on the multilayer reflective film can be expected.

Figure 3:
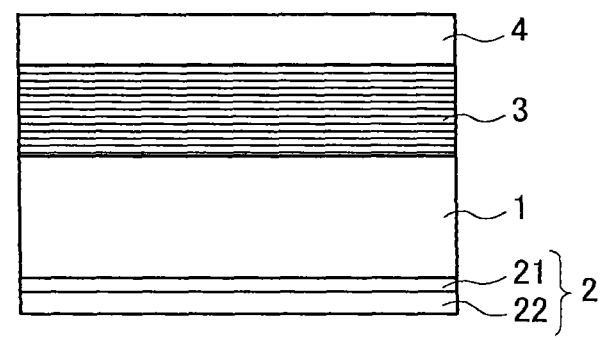
FIG. 3 is a schematic view illustrating an EUV mask blank of the present invention.

Now, the EUV mask blank of the present invention will be disclosed. FIG. 3 is a schematic view illustrating an EUV mask blank of the present invention. In FIG. 3, an absorber layer 4 is provided on a multilayer reflective film 3. Here, a substrate 1, a conductive film 2 and the multilayer reflective film 3 are as shown in FIG. 2 (the substrate with a multilayer reflective film of the present invention). The EUV mask blank of the present invention can be obtained by fixing the substrate with a multilayer reflective film of the present invention on an electrostatic chuck, and forming the absorber layer 4 on the multilayer reflective film 3 by using a sputtering method such as a magnetron sputtering method or an ion beam sputtering method.

In the EUV mask blank of the present invention, a material of the absorber layer 4 to be formed on the multilayer reflective film 3 may, for example, be a material having a high extinction coefficient for EUV light, specifically, Cr, Ta, Pd or a nitride thereof. Among them, a material containing at least one of Ta and Pd as the main component is preferred for the reason that the absorber layer 4 tends to be in an amorphous state, the absorber layer 4 will have a surface having excellent smoothness and having a small surface roughness. In this specification, a material containing at least one of Ta and Pd as the main component means a material containing at least 40 at %, preferably at least 50 at %, more preferably at least 55 at % of at least one of Ta and Pd. Here, the material may contain both of Ta and Pd, and TaPd may be exemplified.

The material containing at least one of Ta and Pd as the main component to be used for the absorber layer 4 may contain, in addition to Ta or Pd, at least one element selected from the group consisting of Hf, Si, Zr, Ge, B, N and H. Specific examples of a material containing the above element in addition to Ta or Pd include TaN, TaNH, PdN, PdNH, TaPdN, TaPdNH, TaHf, TaHfN, TaBSi, TaBSiH, TaBSiN, TaBSiNH, TaB, TaBH, TaBN, TaBNH, TaSi, TaSiN, TaGe, TaGeN, TaZr and TaZrN.

The thickness of the absorber layer 4 is preferably from 50 to 100 nm. The method for forming the absorber layer 4 is not particularly limited so long as it is a sputtering method, and it may be a magnetron sputtering method or an ion beam sputtering method.

When a TaN layer is formed as the absorber layer by an ion beam sputtering method, it is formed preferably to have a thickness of from 50 to 100 nm using a Ta target as a target and a $N_2$ gas (gas pressure: $1.3\times10^{-2}$ Pa to $2.7\times10^{-2}$ Pa) as a sputtering gas under a voltage of form 300 to 1,500 V at a deposition rate of from 0.01 to 0.1 nm/sec.

In the process of forming the absorber layer 4 by using a sputtering method, in order to obtain a uniform film, film deposition is carried out preferably while the substrate 1 is rotated by using a rotator.

In the EUV mask blank of the present invention, a buffer layer may be present between the multilayer reflective film 3 and the absorber layer 4.

A material constituting the buffer layer may, for example, be Cr, Al, Ru, Ta or a nitride thereof, or $SiO_2$, $Si_3N_4$ or $Al_2O_3$. The thickness of the buffer layer is preferably from 10 to 60 nm.

Since the EUV mask blank of the present invention employs the substrate with a multilayer reflective film of the present invention, the multilayer reflective film has extremely few surface defects due to particles. Moreover, at a time of forming the absorber layer while the substrate with a multilayer reflective film is fixed onto an electrostatic chuck, it is possible to prevent generation of particles due to abrasion between the electrostatic chuck and the conductive film 2. Accordingly, the absorber layer also has extremely few surface defects due to particles.

By patterning such an EUV mask blank, it is possible to form an EUV mask having few surface defects. By reducing the number of defects, it is possible to carry out exposure with few defects, and to improve productivity.

Further, in the EUV mask blank of the present invention, the stress generated on the film-forming surface side of the substrate and the stress generated on the back side of the substrate cancel out each other and as a result, deformation of the substrate caused by application of a stress can be suppressed. Specifically, in the case of a 152 mm square substrate which is commonly used for producing an EUV mask blank, the warpage of the substrate formed by application of a stress can be suppressed to be at most 0.8 μm, more preferably at most 0.7 μm, further preferably at most 0.6 μm. Accordingly, a decrease in the accuracy of position of the pattern at the time of patterning the EUV mask blank will be reduced. Further, the possibility of pattern position gap or formation of pattern defects at the time of pattern transfer using a reflective mask prepared from the EUV mask blank will be reduced.

EXAMPLES

Now, the present invention will be disclosed in further detail with reference to Examples. However, it should be understood that the present invention is by no means restricted to such specific Examples.

Example 1

In this Example, a substrate with a conductive film shown in FIG. 1, i.e. a substrate with a conductive film comprising a substrate 1 and on at least one surface of the substrate 1, a two-layer structure conductive film 2 (lower layer 21, upper layer 22) formed was prepared.

A glass substrate of $SiO_2$—$TiO_2$ glass (external dimensions: 6 inches (152.4 mm) square, thickness: 6.3 mm) was used as a substrate 1 for film-forming. This glass substrate has a thermal expansion coefficient of $0.02 \times 10^{-7}/°$ C. (at 20° C., this condition is applicable hereinafter), and a Young's modulus of 67 GPa. This glass substrate was polished to have a smooth surface having a surface roughness (rms) of at most 0.15 nm and a flatness of at most 100 nm.

[Formation of Lower Layer 21]

On the surface of the substrate 1, a CrOH film as a lower layer 21 was deposited by using a magnetron sputtering method. Specifically, after a deposition chamber was evacuated of air to be at most $1 \times 10^{-4}$ Pa, magnetron sputtering was carried out by using a Cr target in an atmosphere of a mixed gas of Ar, $O_2$ and $H_2$, to form a lower layer 21 (CrOH film) of 10 nm thick. The deposition conditions for the lower layer 21 (CrOH film) are as follows.

Target: Cr target
Sputtering gas: mixed gas of Ar, $O_2$ and $H_2$ (Ar: 29.1 vol %, $O_2$: 70 vol %, $H_2$: 0.9 vol %, gas pressure: 0.1 Pa)
Input power: 1,500 W
Deposition rate: 0.23 nm/sec
Film thickness: 10 nm

[Compositional Analysis of Lower Layer 21 (CrOH Film)]

The composition of the lower layer 21 was measured by using an X-ray photoelectron spectrometer (manufactured by PERKIN ELMER-PHI) and a Rutherford back scattering spectroscopy (manufactured by Kobe Steel, Ltd.). The compositional ratio (at %) of the lower layer 21 was Cr:O:H=71.8: 27.9:0.3. Further, the compositional ratio (at %) of Cr to O was Cr:O=2.4:1.

[State of Lower Layer 21]

The state of the lower layer 21 was confirmed by an X-ray diffractometer (manufactured by RIGAKU Corporation). Since no sharp peak was observed among the diffraction peaks obtained, it was confirmed that the crystal state of the lower layer 21 was an amorphous structure or a microcrystal structure.

[Formation of Upper Layer 22]

Then, on the lower layer 21, a CrNH film as an upper layer 22 was deposited by a magnetron sputtering method. Specifically, after a deposition chamber was evacuated of air to be at most $1 \times 10^{-4}$ Pa, magnetron sputtering was carried out by using a Cr target in an atmosphere of a mixed gas of Ar, $N_2$ and $H_2$ to form an upper layer 22 (CrNH film) of 140 nm thick. The deposition conditions for the upper layer 22 (CrNH film) are as follows.

Target: Cr target
Sputtering gas: mixed gas of Ar, $N_2$ and $H_2$ (Ar: 58.2 vol %, $N_2$: 40 vol %, $H_2$: 1.8 vol %, gas pressure: 0.1 Pa)
Input power: 1,500 W
Deposition rate: 0.18 nm/sec
Film thickness: 140 nm

[Compositional Analysis of Upper Layer 22 (CrNH Film)]

In the same procedure as for the lower layer 21, the composition of the upper layer 22 was measured by an X-ray photoelectron spectrometer. The compositional ratio (at %) of the upper layer 22 was Cr:N:H=86.0:13.7:0.3. Further, the compositional ratio (at %) of Cr to N was Cr:N=3.1:0.5.

[State of Upper Layer 22]

In the same procedure as for the lower layer 21, the state of the upper layer 22 was confirmed by an X-ray diffractometer. Since no sharp peak was observed among the diffraction peaks obtained, it was confirmed that the state of the upper layer 22 was an amorphous structure or a microcrystal structure.

[Sheet Resistance of Conductive Film 2]

The sheet resistance of the two-layer structure conductive film 2 formed by the above procedure was measured by using a four-probe meter. The sheet resistance of the conductive film 2 was 7.5Ω/□.

[Surface Roughness (Rms) of Conductive Film 2]

The surface roughness of the two-layer structure conductive film 2 formed by the above procedure was measured by using an atomic force microscope (SPI-3800 manufactured by Seiko Instruments Inc.) in dynamic force mode. The area for measurement for surface roughness was 1 μm×1 μm, and SI-DF40 (manufactured by Seiko Instruments Inc.) was used as a cantilever. The surface roughness (rms) of the conductive film 2 was 0.2 nm.

[Evaluation of Defects on the Surface of Conductive Film 2]

The number of particles on the surface of the two-layer structure conductive film 2 formed by the above procedure was measured by a defect inspection apparatus (M1350 manufactured by Lasertec Corporation). As a result, the number of particles was 0.025 particle/cm$^2$, and the conductive film 2 was confirmed to be a conductive film with few defects due to particles. Here, the number of particles is the number of particle having a size of 0.5 μm or larger.

[Adhesion of Conductive Film 2]

On the surface of the two-layer structure conductive film 2 formed by the above procedure, a grid pattern was formed in accordance with a cross-cut adhesion test method as disclosed in JIS K5400 to prepare a test sample. Then, a pressure-sensitive adhesive tape (cellophane tape manufactured by NICHIBAN CO., LTD.) was bonded to the grid pattern of the test sample and then quickly pulled in a direction of 90° and peeled, and a test on whether peeling occurred on 100 squares or not was carried out. As a result, no peeling occurred on the squares.

[Film Stress of Conductive Film 2]

The film stress of the two-layer structure conductive film 2 formed by the above procedure was measured as follows.

The radius of curvature of the substrate with a conductive film was calculated by a laser interferometer, and the internal stress was calculated from the Young's modulus and the Poisson's ratio of the substrate 1 and the film thickness of the conductive film 2. As a result, it was confirmed that a compressive stress of 600 MPa was generated in the conductive film 2.

Then, using the substrate with a conductive film obtained by the above procedure, a multilayer reflective film (Mo/Si multilayer reflective film) was formed by the following procedure to prepare a substrate with a multilayer reflective film shown in FIG. 2.

[Formation of Multilayer Reflective Film]

In a state where the conductive film 2 formed by the above procedure was clamped by an electrostatic chuck, a multilayer reflective film 3 (Mo/Si multilayer reflective film) was formed on a side (film-forming surface) of the substrate 1 opposite from the conductive film 2 by an ion beam sputtering method. Specifically, by repeating 40 cycles of alternately depositing Si films and Mo films, a Mo/Si multilayer reflective film having a total film thickness of 272 nm ((4.5 nm (Si film)+2.3 nm (Mo film)×40) was formed. Finally, a Si layer of 11.0 nm thick was formed as a cap layer.

Here, the deposition conditions for the Si films and the Mo films are as follows.

[Deposition Conditions for Si Films]
  Target: Si target (boron-doped)
  Sputtering gas: Ar gas (gas pressure: 0.02 Pa)
  Voltage: 700 V
  Deposition rate: 0.077 nm/sec
  Film thickness: 4.5 nm

[Deposition Conditions for Mo Films]
  Target: Mo target
  Sputtering gas: Ar gas (gas pressure: 0.02 Pa)
  Voltage: 700 V
  Deposition rate: 0.064 nm/sec
  Film thickness: 2.3 nm

[Evaluation of Surface Defects]

The number of particles on the multilayer reflective film formed by the above procedure was measured by a defect inspection apparatus. As a result, the number of particles was 0.5 particle/cm$^2$, and it was confirmed that very few particles were generated at the time of forming the multilayer reflective film, and the multilayer reflective film was a multilayer reflective film with few surface defects by particles. Here, the number of particles is the number of particles having a size of 0.15 μm or larger.

Then, using the substrate with a multilayer reflective film obtained by the above procedure, an absorber layer 4 was formed by the following procedure to prepare an EUV mask blank shown in FIG. 3.

[Formation of Absorber Layer]

On the multilayer reflective film 3 (Mo/Si multilayer reflective film) formed by the above procedure, a TaN layer was formed as an absorber layer 4 for EUV light by an ion beam sputtering method, to obtain an EUV mask blank. The deposition conditions are as follows.

[Deposition Conditions for TaN Layer]
  Target: Ta target
  Sputtering gas: N$_2$ gas (gas pressure: 0.02 Pa)
  Voltage: 700 V
  Deposition rate: 0.015 nm/sec
  Film thickness: 70 nm

[Evaluation of Surface Defects]

The number of particles on the surface of the absorber layer of the EUV mask blank prepared by the above procedure was also measured by the same procedure as above, whereupon it was 2.0 particles/cm$^2$, and the EUV mask blank was confirmed to be an EUV mask blank having few surface defects due to particles.

[Measurement of Warpage of Substrate]

The warpage of the substrate in the EUV mask blank prepared by the above procedure was measured. As a result, the warpage of the substrate was 0.55 μm.

Here, the warpage of the substrate was obtained by measuring the shape by a laser interferometer, and based on an assumed plane calculated by the least-squares method of all data on the substrate surface in a measurement region as the standard surface, calculating the difference between the positive maximum value and the negative minimum value in the measured region.

Example 2

In this Example, a substrate with a conductive film, a substrate with a multilayer reflective film and an EUV mask blank were prepared under the same conditions in the same procedure as in Example 1 except that the film thicknesses of the respective layers of the two-layer structure conductive film 2 (lower layer 21, upper layer 22) were changed.

[Formation of Lower Layer 21]

On the surface of the same glass substrate (substrate 1) of SiO$_2$—TiO$_2$ glass as in Example 1, a CrOH film was formed as a lower layer 21 by a magnetron sputtering method. Specifically, after a deposition chamber was evacuated of air to be at most 1×10$^{-4}$ Pa, magnetron sputtering was carried out by using a Cr target in an atmosphere of a mixed gas of Ar, O$_2$ and H$_2$ to form a lower layer 21 (CrOH film) of 20 nm thick. The deposition conditions for the lower layer 21 (CrOH film) are as follows.

Target: Cr target
  Sputtering gas: mixed gas of Ar, O$_2$ and H$_2$ (Ar: 29.1 vol %, O$_2$: 70 vol %, H$_2$: 0.9 vol %, gas pressure: 0.1 Pa)
  Input power: 1,500 W
  Deposition rate: 0.23 nm/sec
  Film thickness: 20 nm

[Compositional Analysis and State of Lower Layer 21 (CrOH Film)]

Measurement was carried out by the same apparatus under the same conditions as in Example 1, whereupon the compositional ratio (at %) of the lower layer 21 was CrO:H=71.8: 27.9:0.3, and it was confirmed that the state of the lower layer 21 was an amorphous structure or a microcrystal structure.

[Formation of Upper Layer 22]

Then, on the lower layer 21, a CrNH film was formed as an upper layer 22 by a magnetron sputtering method. Specifically, after a deposition chamber was evacuated of air to be at most $1 \times 10^{-4}$ Pa, magnetron sputtering was carried out by using a Cr target in an atmosphere of a mixed gas of Ar, $N_2$ and $H_2$, to form an upper layer 22 (CrNH film) of 180 nm thick. The deposition conditions for the upper layer 22 (CrNH film) are as follows.

Target: Cr target
Sputtering gas: mixed gas of Ar, $N_2$ and $H_2$ (Ar: 58.2 vol %, $N_2$: 40 vol %, $H_2$: 1.8 vol %, gas pressure: 0.1 Pa)
Input power: 1,500 W
Deposition rate: 0.18 nm/sec
Film thickness: 180 nm

[Compositional Analysis and State of Lower Layer 22 (CrNH Film)]

Measurement was carried out by the same apparatus under the same conditions as in Example 1, whereupon the compositional ratio (at %) of the upper layer 22 was Cr:N:H=86.0: 13.7:0.3, and it was confirmed that the state of the upper layer 22 was an amorphous structure or a microcrystal structure.

[Sheet Resistance of Conductive Film 2]

The sheet resistance of the two-layer structure conductive film 2 formed by the above procedure was measured by a four-probe meter. The sheet resistance of the conductive film 2 was 5.4Ω/□.

[Surface Roughness (Rms) of Conductive Film 2]

The surface roughness of the two-layer structure conductive film 2 formed by the above procedure was measured by the same apparatus under the same conditions as in Example 1, whereupon the surface roughness (rms) of the conductive film 2 was 0.2 nm.

[Evaluation of Defects on the Surface of Conductive Film 2]

The number of particles on the surface of the two-layer structure conductive film 2 formed by the above procedure was measured by the same apparatus under the same conditions as in Example 1, whereupon the number of particles was 0.020 particle/cm$^2$, and the conductive film 2 was confirmed to be a conductive film having few defects by particles.

[Adhesion of Conductive Film 2]

Adhesion of the surface of the two-layer structure conductive film 2 formed by the above procedure was examined under the same conditions as in Example 1, whereupon no peeling occurred on the 100 squares.

[Film Stress of Conductive Film 2]

The film stress of the two-layer structure conductive film 2 formed by the above procedure was examined under the same conditions as in Example 1, whereupon it was confirmed that a compressive stress of 590 MPa was generated in the conductive film 2.

[Formation of Multilayer Reflective Film and Evaluation of Surface Defects]

Then, using the substrate with a conductive film obtained by the above procedure, a multilayer reflective film (Mo/Si multilayer reflective film) was formed under the same conditions as in Example 1, to prepare a substrate with a multilayer reflective film as shown in FIG. 2. The number of particles on the multilayer reflective film formed by the above procedure was measured by a defect inspection apparatus. As a result, the number of particles was 0.3 particle/cm$^2$, and it was confirmed that very few particles were generated at the time of forming the multilayer reflective film, and the multilayer reflective film was a multilayer reflective film having few surface defects due to particles.

[Formation of Absorber Layer and Evaluation of Surface Defect]

Then, using the substrate with a multilayer reflective film obtained by the above procedure, an absorber layer 4 was formed under the same conditions as in Example 1 to prepare an EUV mask blank as shown in FIG. 3. The number of particles on the surface of the absorber layer of the EUV mask blank prepared by the above procedure was also measured by the same procedure as above, whereupon it was 0.7 particle/cm$^2$, and the EUV mask blank was confirmed to be an EUV mask blank having few surface defects due to particles.

[Measurement of Warpage of Substrate]

The warpage of the substrate in the EUV mask blank prepared by the above procedure was measured. As a result, the warpage of the substrate was 0.47 μm.

Comparative Example 1

In Comparative Example 1, a CrN film as a conductive film was formed on a substrate by a magnetron sputtering method to prepare a substrate with a conductive film. The deposition conditions for the CrN film are as follows.

Target: Cr target
Sputtering gas: mixed gas of Ar and $N_2$ (Ar: 30 vol %, $N_2$: 70 vol %, gas pressure: 0.1 Pa)
Input power: 1,500 W
Deposition rate: 0.10 nm/sec
Film thickness: 140 nm Compositional analysis of the conducive film was carried out in the same procedure as in Example 1, whereupon the compositional ratio (at %) of the conductive film was Cr:N: O=55.4:42.5:2.1.

Further, the state of the conductive film was confirmed by an X-ray diffractometer, whereupon the conductive film was confirmed to have a crystalline structure since a sharp peak was observed among the diffraction peaks obtained.

Further, the sheet resistance of the conductive film was measured by the same method as in Example 1, whereupon it was 75Ω/□.

Further, the surface roughness (rms) of the conductive film was measured by the same method as in Example 1, whereupon it was 0.52 nm.

Further, evaluation of defects on the surface of the conductive film was carried out by the same method as in Example 1, whereupon the number of particles was 1.0 particle/cm$^2$, and the conductive film was confirmed to be a conductive film having many defects due to particles.

Further, adhesion of the conductive film was evaluated by the same method as in Example 1 and as a result, it was confirmed that film peeling occurred.

Further, the film stress of the conductive film was measured by the same method as in Example 1, whereupon it was confirmed that a compressive stress of 550 MPa was generated in the conductive film.

Further, a Mo/Si multilayer reflective film was formed on the film-forming surface of the substrate in the same procedure as in Example 1 to prepare a substrate with a multilayer reflective film, and the number of particles on the multilayer reflective film was measured by a defect inspection apparatus. As a result, the number of particles was 10 particles/cm$^2$ or more, and the multilayer reflective film was confirmed to be a multilayer reflective film having a very large number of surface defects due to particles.

On the substrate with a multilayer reflective film prepared by the above procedure, an absorber layer was formed by the same procedure as in Example 1 to prepare an EUV mask blank. The number of particles on the surface of the absorber layer of the EUV mask blank prepared was measured by a defect inspection apparatus. As a result, the number of particles was 10 particles/cm$^2$ or more, and the EUV mask blank was confirmed to be an EUV mask blank having a very large number of surface defects due to particles.

Further, the warpage of the substrate in the EUV mask blank prepared by the above procedure was measured, whereupon the warpage of the substrate was 0.6 μm.

Comparative Example 2

In Comparative Example 2, a CrN film as a conductive film was formed on a substrate by a magnetron sputtering method to prepare a substrate with a conductive film. The deposition conditions for the CrN film are as follows.

Target: Cr target
Sputtering gas: mixed gas of Ar and N$_2$ (Ar: 60 vol %, N$_2$: 40 vol %, gas pressure: 0.1 Pa)
Input power: 1,500 W
Deposition rate: 0.15 nm/sec
Film thickness: 140 nm Compositional analysis of the conducive film was carried out in the same procedure as in Example 1, whereupon the compositional ratio (at %) of the conductive film was Cr:N=85.0:15.0.

Further, the state of the conductive film was confirmed by an X-ray diffractometer, whereupon the state of the conductive film was confirmed to be an amorphous structure or a microcrystal structure since no sharp peak was observed among the diffraction peaks obtained.

Further, the sheet resistance of the conductive film was measured by the same method as in Example 1, whereupon it was 6.8Ω/□.

Further, the surface roughness (rms) of the conductive film was measured by the same method as in Example 1, whereupon it was 0.21 nm.

Further, evaluation of defects on the surface of the conductive film was carried out by the same method as in Example 1, whereupon the number of particles was 0.025 particle/cm$^2$, and the conductive film was confirmed to be a conductive film having many defects due to particles.

Further, adhesion of the conductive film was evaluated by the same method as in Example 1 and as a result, it was confirmed that film peeling occurred.

Further, the film stress of the conductive film was measured by the same method as in Example 1, whereupon it was confirmed that a tensile stress of 55 MPa was generated in the conductive film.

Further, a Mo/Si multilayer reflective film was formed on the film-forming surface of the substrate in the same procedure as in Example 1 to prepare a substrate with a multilayer reflective film, and the number of particles on the multilayer reflective film was measured by a defect inspection apparatus. As a result, the number of particles was 10 particles/cm$^2$ or more, and the multilayer reflective film was confirmed to be a multilayer reflective film having a very large number of surface defects due to particles.

On the substrate with a multilayer reflective film prepared by the above procedure, an absorber layer was formed by the same procedure as in Example 1 to prepare an EUV mask blank. The number of particles on the surface of the absorber layer of the EUV mask blank prepared was measured by a defect inspection apparatus. As a result, the number of particles was 10 particles/cm$^2$ or more, and the EUV mask blank was confirmed to be an EUV mask blank having a very large number of surface defects due to particles.

Further, the warpage of the substrate in the EUV mask blank prepared by the above procedure was measured, whereupon the warpage of the substrate was 1.1 μm, and it was confirmed that the warpage of the substrate was significant.

Comparative Example 3

In Comparative Example 3, a CrNH film as a conductive film was formed on a substrate by a magnetron sputtering method to prepare a substrate with a conductive film. The deposition conditions for the CrNH film are as follows.

Target: Cr target
Sputtering gas: mixed gas of Ar, H$_2$ and N$_2$ (Ar: 58.2 vol %, H$_2$: 1.8 vol %, N$_2$: 40 vol %, gas pressure: 0.1 Pa)
Input power: 1,500 W
Deposition rate: 0.15 nm/sec
Film thickness: 140 nm Compositional analysis of the conducive film was carried out in the same procedure as in Example 1, whereupon the compositional ratio (at %) of a conductive film was Cr:N:H=85.2:13.9:0.9.

Further, the state of the conductive film was confirmed by an X-ray diffractometer, whereupon the state of the conductive film was confirmed to be an amorphous structure or a microcrystal structure since no sharp peak was observed among the diffraction peaks obtained.

Further, the sheet resistance of the conductive film was measured by the same method as in Example 1, whereupon it was 7.1Ω/□.

Further, the surface roughness (rms) of the conductive film was measured by the same method as in Example 1, whereupon it was 0.22 nm.

Further, evaluation of defects on the surface of the conductive film was carried out by the same method as in Example 1, whereupon the number of particles was 0.025 particle/cm$^2$, and the conductive film was confirmed to be a conductive film having very few defects due to particles.

Further, adhesion of the conductive film was evaluated by the same method as in Example 1 and as a result, it was confirmed that film peeling occurred.

Further, the film stress of the conductive film was measured by the same method as in Example 1, whereupon it was confirmed that a compressive stress of 567 MPa was generated in the conductive film.

Further, a Mo/Si multilayer reflective film was formed on the film-forming surface of the substrate in the same procedure as in Example 1 to prepare a substrate with a multilayer reflective film, and the number of particles on the multilayer reflective film was measured by a defect inspection apparatus. As a result, the number of particles was 10 particles/cm$^2$ or more, and the multilayer reflective film was confirmed to be a multilayer reflective film having a very large number of surface defects due to particles.

On the substrate with a multilayer reflective film prepared by the above procedure, an absorber layer was formed by the same procedure as in Example 1 to prepare an EUV mask blank. The number of particles on the surface of the absorber layer of the EUV mask blank prepared was measured by a defect inspection apparatus. As a result, the number of particles was 10 particles/cm$^2$ or more, and the EUV mask blank was confirmed to be an EUV mask blank having a very large number of surface defects due to particles.

Further, the warpage of the substrate in the EUV mask blank prepared by the above procedure was measured, whereupon the warpage of the substrate was 0.63 μm.

Comparative Example 4

In Comparative Example 4, a CrO film as a lower layer of a two-layer structure conductive film and a CrN film as an upper layer were formed on a substrate by a magnetron sputtering method to prepare a substrate with a conductive film. The deposition conditions for the CrO film and the CrN film are respectively as follows.

Deposition Conditions for CrO Film
  Target: Cr target
  Sputtering gas: mixed gas of Ar and $O_2$ (Ar: 30 vol %, $O_2$: 70 vol %, gas pressure: 0.1 Pa)
  Input power: 1,500 W
  Deposition rate: 0.24 nm/sec
  Film thickness: 10 nm Deposition Conditions for CrN Film
  Target: Cr target
  Sputtering gas: mixed gas of Ar and $N_2$ (Ar: 60 vol %, $N_2$: 40 vol %, gas pressure: 0.1 Pa)
  Input power: 1,500 W
  Deposition rate: 0.18 nm/sec
  Film thickness: 140 nm Compositional analysis of the lower layer (CrO film) of the conductive film was carried out by the same procedure as in Example 1, whereupon the compositional ratio (at %) of the lower layer of the conductive film was Cr:O=85.8:14.2.

Compositional analysis of the upper layer (CrN film) of the conductive film was carried out, whereupon the compositional ratio (at %) of the upper layer (CrN film) of the conductive film was Cr:N=86.0:14.0.

Further, the state of the lower layer (Cr0 film) of the conductive film was confirmed by an X-ray diffractometer, whereupon the state of the conductive film was confirmed to be an amorphous structure or a microcrystal structure since no sharp peak was observed among the diffraction peaks obtained.

Further, the state of the upper layer (CrN film) of the conductive film was confirmed by an X-ray diffractometer, whereupon the state of the conducive film was confirmed to be an amorphous structure or a microcrystal structure, since no sharp peak was observed among the diffraction peaks obtained.

Further, the sheet resistance of the conductive film was measured by the same method as in Example 1, whereupon it was 7.8Ω/□.

Further, the surface roughness (rms) of the conductive film was measured by the same method as in Example 1, whereupon it was 0.20 nm.

Further, evaluation of defects on the surface of the conductive film was carried out in the same manner as in Example 1, whereupon the number of particles was at most 0.025 particle/$cm^2$, and the conductive film was confirmed to be a conductive film having very few defects due to particles.

Further, adhesion of the conductive film was evaluated by the same method as in Example 1, whereupon no film peeling occurred, and it was confirmed that the conductive film has high adhesion.

Further, the film stress of the conductive film was measured by the same method as in Example 1, whereupon it was confirmed that a tensile stress of 65 MPa was generated in the conductive film.

Further, a Mo/Si multilayer reflective film was formed on the film-forming surface of the substrate by the same procedure as in Example 1 to prepare a substrate with a multilayer reflective film, and the number of particles on the multilayer reflective film was measured by a defect inspection apparatus. As a result, the number of particles was at most 0.025 particle/$cm^2$, and the multilayer reflective film was confirmed to be a multilayer reflective film having very few surface defects due to particles.

On the substrate with a multilayer reflective film prepared by the above procedure, an absorber layer was formed by the same procedure as in Example 1 to prepare an EUV mask blank. The number of particles on the surface of the absorber layer of the EUV mask blank prepared was measured by a defect inspection apparatus. As a result, the number of particles was at most 0.025 particle/$cm^2$, and the EUV mask blank was confirmed to be an EUV mask blank having very few surface defects due to particles.

Further, the warpage of the substrate in the EUV mask blank prepared by the above procedure was measured, whereupon the warpage of the substrate was 1.1 μm, and it was confirmed that the warpage of the substrate was significant.

INDUSTRIAL APPLICABILITY

According to the substrate with a conductive film of the present invention, peeling of the conductive film from the substrate can be suppressed while the sheet resistance of the conductive film is made low, and in addition, due to a small surface roughness on the surface of the conductive film, contact between the substrate with a conductive film and an electrostatic chuck will be improved, and the clamping force by the electrostatic chuck will be improved. As a result, by the improvement in contact with the electrostatic chuck, generation of particles due to abrasion between the electrostatic chuck and the substrate will be prevented, and such is particularly useful when the substrate with a conductive film is fixed to an electrostatic chuck to produce an EUV mask blank.

This application is a continuation of PCT Application No. PCT/JP2012/052542, filed on Feb. 3, 2012, which is based upon and claims the benefit of priority from Japanese Patent Application No. 2011-022769 filed on Feb. 4, 2011. The contents of those applications are incorporated herein by reference in its entirety.

REFERENCE SYMBOLS

1: substrate
2: conductive film
21: lower layer
22: upper layer
3: multilayer reflective film
4: absorber layer

What is claimed is:
1. A substrate with a conductive film to be used for producing a reflective mask blank for EUV lithography, comprising a conductive film formed on a substrate;
  wherein the conductive film has at least two layers of a layer (lower layer) formed on the substrate side and a layer (upper layer) formed on the lower layer; and
  the lower layer of the conductive film contains chromium (Cr), oxygen (O) and hydrogen (H), and the upper layer of the conductive film contains chromium (Cr), nitrogen (N) and hydrogen (H).

2. The substrate with a conductive film according to claim 1, wherein in the lower layer of the conductive film, the total content of Cr and O is from 85 to 99.9 at %, and the content of H is from 0.1 to 15 at %.

3. The substrate with a conductive film according to claim 2, wherein the compositional ratio (atomic ratio) of Cr to O in the lower layer of the conductive film is Cr:O=9:1 to 3:7.

4. The substrate with a conductive film according to claim 1, wherein in the upper layer of the conductive film, the total content of Cr and N is from 85 to 99.9 at %, and the content of H is from 0.1 to 15 at %.

5. The substrate with a conductive film according to claim 4, wherein the compositional ratio (atomic ratio) of Cr to N in the upper layer of the conductive film is Cr:N=9.5:0.5 to 3:7.

6. The substrate with a conductive film according to claim 1, wherein the film thickness of the lower layer of the conductive film is from 1 to 30 nm.

7. The substrate with a conductive film according to claim 1, wherein the film thickness of the upper layer of the conductive film is from 50 to 300 nm.

8. The substrate with a conductive film according to claim 1, wherein the sheet resistance of the conductive film is at most 20Ω/□.

9. The substrate with a conductive film according to claim 1, wherein the conductive film has a compressive stress of from 300 MPa to 900 MPa.

10. The substrate with a conductive film according to claim 1, wherein the lower layer of the conductive film is in an amorphous state.

11. The substrate with a conductive film according to claim 1, wherein the upper layer of the conductive film is in an amorphous state.

12. The substrate with a conductive film according to claim 1, wherein the surface roughness (rms) of the conductive film is at most 0.5 nm.

13. The substrate with a conductive film according claim 1, wherein the lower layer of the conductive film is formed by a sputtering method using a Cr target in an atmosphere containing an inert gas including at least one member selected from the group consisting of helium (He), argon (Ar), neon (Ne), krypton (Kr) and xenon (Xe), and oxygen ($O_2$) and hydrogen ($H_2$), at an atmospheric temperature during sputtering of from 60 to 120° C.

14. The substrate with a conductive film according to claim 1, wherein the upper layer of the conductive film is formed by a sputtering method using a Cr target in an atmosphere containing an inert gas including at least one member selected from the group consisting of helium (He), argon (Ar), neon (Ne), krypton (Kr) and xenon (Xe), and nitrogen ($N_2$) and hydrogen ($H_2$), at an atmospheric temperature during sputtering of from 60 to 120° C.

15. A substrate with a multilayer reflective film for a reflective mask blank for EUV lithography, which is the substrate with a conductive film as defined in claim 1, further comprising a multilayer reflective film formed on a surface of the substrate opposite from a surface on which the conductive film is formed.

16. The substrate with a multilayer reflective film according to claim 15, wherein the warpage of the substrate is at most 0.8 μm.

17. A reflective mask blank for EUV lithography, which is the substrate with a multilayer reflective film as defined in claim 15, further comprising an absorber layer formed on the multilayer reflective film.

18. The reflective mask blank for EUV lithography according to claim 17, which is the substrate with a multilayer reflective film further comprising an absorber layer formed on the multilayer reflective film, wherein the warpage of the substrate is at most 0.8 μm.

19. A reflective mask for EUV lithography produced by patterning the reflective mask blank for EUV lithography as defined in claim 17.

* * * * *